(12) United States Patent
Baek et al.

(10) Patent No.: US 11,765,834 B2
(45) Date of Patent: Sep. 19, 2023

(54) ELECTRONIC MODULE AND METHOD OF MANUFACTURING THE SAME

(71) Applicant: Samsung Display Co., Ltd., Yongin-si (KR)

(72) Inventors: In-Su Baek, Seoul (KR); Seung Hwan Baek, Seoul (KR); Hyungwoo Kwon, Seongnam-si (KR); Gyunsoo Kim, Daejeon (KR); Kijong Kim, Cheonan-si (KR); Minki Kim, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/939,031

(22) Filed: Jul. 26, 2020

(65) Prior Publication Data

US 2021/0059052 A1 Feb. 25, 2021

(30) Foreign Application Priority Data

Aug. 19, 2019 (KR) .......................... 10-2019-0101324

(51) Int. Cl.
*H05K 1/18* (2006.01)
*H05K 5/00* (2006.01)

(52) U.S. Cl.
CPC ........... *H05K 1/189* (2013.01); *H05K 5/0017* (2013.01); *H05K 2201/10128* (2013.01); *H05K 2201/2009* (2013.01)

(58) Field of Classification Search
CPC ...................................... H05K 1/189
USPC ......................................................... 361/748
See application file for complete search history.

(56) References Cited

U.S. PATENT DOCUMENTS

| | | | | |
|---|---|---|---|---|
| 2012/0267803 | A1* | 10/2012 | Lee | H01L 23/295 257/798 |
| 2013/0184566 | A1* | 7/2013 | Kreischer | G01R 33/34084 600/422 |
| 2017/0013722 | A1* | 1/2017 | Kim | H01L 24/29 |
| 2018/0069067 | A1* | 3/2018 | Oh | H05K 1/181 |
| 2018/0358770 | A1* | 12/2018 | Light | H01R 12/7082 |
| 2020/0192433 | A1* | 6/2020 | Shin | G06F 1/1652 |
| 2020/0404782 | A1* | 12/2020 | Chen | H05K 1/0373 |
| 2021/0258695 | A1* | 8/2021 | Wang | B32B 27/285 |
| 2022/0057873 | A1* | 2/2022 | Kubota | H01L 27/32 |

FOREIGN PATENT DOCUMENTS

| KR | 20-0461804 | 7/2012 |
|---|---|---|
| KR | 10-2015-0061769 | 6/2015 |
| KR | 10-2015-0114407 | 10/2015 |
| KR | 10-1713193 | 3/2017 |
| KR | 10-2019-0057482 | 5/2019 |

* cited by examiner

*Primary Examiner* — Stanley Tso
(74) *Attorney, Agent, or Firm* — H.C. Park & Associates, PLC (57) ABSTRACT

An electronic module including an electronic panel, a circuit unit, a support film, and a connection portion. The circuit unit includes a circuit film electrically connected to the electronic panel and a circuit chip mounted on the circuit film. The support film is attached to the circuit film. The connection portion is attached to the support film and covers the circuit chip.

14 Claims, 7 Drawing Sheets

ELECTRONIC MODULE AND METHOD OF MANUFACTURING THE SAME

CROSS-REFERENCE TO RELATED APPLICATION

This application claims priority from and the benefit of Korean Patent Application No. 10-2019-0101324, filed on Aug. 19, 2019, the contents of which are hereby incorporated by reference in its entirety.

BACKGROUND

Field

Embodiments of the present invention relate to an electronic module having improved reliability, and a method of manufacturing the electronic module.

Discussion of the Background

An electronic module is operated in response to electrical signals applied thereto. The electronic module receives the electrical signals to display an image or to sense a touch event. The electronic module includes an electronic panel and a circuit unit to drive the electronic panel. The circuit unit is provided separately from the electronic panel and connected to the electronic panel through a flexible circuit board, or the circuit unit is provided with a circuit board to be connected directly to the electronic panel.

The above information disclosed in this Background section is only for understanding of the background of the inventive concepts, and, therefore, it may contain information that does not constitute prior art.

SUMMARY

Embodiments of the present invention provide an electronic module having improved reliability.

Embodiments of the present invention also provide a method of manufacturing the electronic module.

Additional features of the inventive concepts will be set forth in the description which follows, and in part will be apparent from the description, or may be learned by practice of the inventive concepts.

An embodiment of the inventive concept provides an electronic module including an electronic panel, a circuit unit, a support film, and a connection portion. The circuit unit includes a circuit film electrically connected to the electronic panel and a circuit chip mounted on the circuit film. The support film is attached to the circuit film. The connection portion is attached to the support film and covers the circuit chip.

The support film may not overlap the circuit chip.

The circuit film may include a first circuit area connected to the electronic panel and a second circuit area connected to the first circuit area, and the support film may include a first support area attached to the first circuit area and a second support area attached to the second circuit area.

The connection portion may overlap the first support area, the second support area, and the circuit chip when viewed in a plane.

The first circuit area may extend in a first direction, the second circuit area may extend from the first circuit area in a second direction crossing the first direction, the first support area may extend in the first direction, and the second support area may extend in the second direction from the first support area.

The connection portion may include a connection film, a first filler disposed between the first support area and the connection film, and a second filler disposed between the second support area and the connection film.

An upper surface of the connection film may be flat.

The connection portion may further include a first adhesive layer disposed between the first filler and the first support area, a second adhesive area disposed between the first filler and the connection film, a third adhesive layer disposed between the second filler and the second support area, and a fourth adhesive layer disposed between the second filler and the connection film.

The electronic module may further include a fifth adhesive layer disposed between the circuit chip and the connection film.

Each of the first adhesive layer, the second adhesive layer, the third adhesive layer, and the fourth adhesive layer may have an adhesive force greater than an adhesive force of the fifth adhesive layer.

Each of the first adhesive layer, the second adhesive layer, the third adhesive layer, and the fourth adhesive layer may have a thickness greater than a thickness of the fifth adhesive layer.

The first support area and the second support area may be spaced apart from each other with the circuit chip interposed therebetween when viewed in a plane.

The support film may include the same material as the connection film.

Another embodiments of the inventive concept provides a method of manufacturing an electronic module including disposing an electronic module including an electronic panel and a circuit unit including a circuit film electrically connected to the electronic panel and a circuit chip mounted on the circuit film, attaching a support film to the circuit film, attaching a connection portion onto the support film and the circuit chip, bending the circuit film, and removing the support film and the connection portion from the circuit unit.

The bending of the circuit film may include adsorbing the support film and bending the support film and the circuit film while the support film is adsorbed.

The connection portion may include a connection film, a first filler disposed between the support film and the connection film, and a second filler spaced apart from the first filler with the circuit chip interposed therebetween.

The connection portion may further include a first adhesive layer disposed between the first filler and the support film, a second adhesive area disposed between the first filler and the connection film, a third adhesive layer disposed between the second filler and the support film, and a fourth adhesive layer disposed between the second filler and the connection film.

The method may further include a fifth adhesive layer disposed between the circuit chip and the connection film.

Each of the first adhesive layer, the second adhesive layer, the third adhesive layer, and the fourth adhesive layer may have an adhesive force greater than an adhesive force of the fifth adhesive layer.

Each of the first adhesive layer, the second adhesive layer, the third adhesive layer, and the fourth adhesive layer may have a thickness greater than a thickness of the fifth adhesive layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the inventive concepts.

DETAILED DESCRIPTION

In the following description, for the purposes of explanation, numerous specific details are set forth in order to provide a thorough understanding of various embodiments of the invention. As used herein "embodiments" are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, the present invention will be explained in detail with reference to the accompanying drawings.

Figure 1:
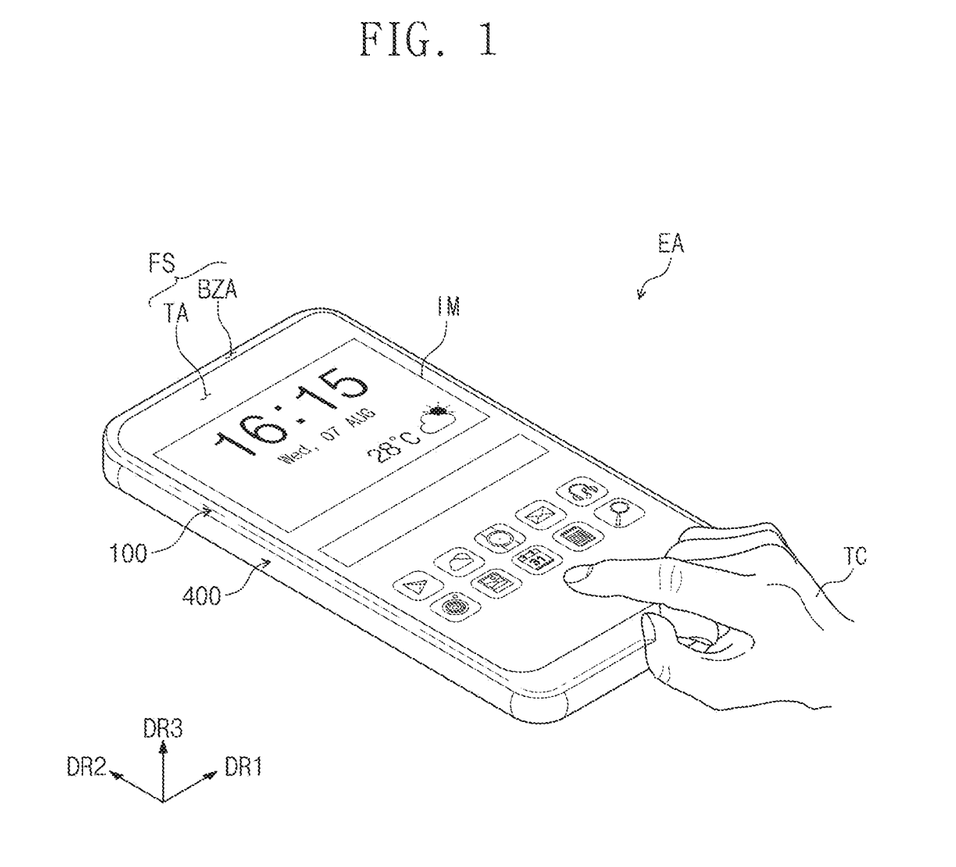
FIG. 1 is a perspective view showing an electronic apparatus according to an embodiment of the present invention.
Figure 2:
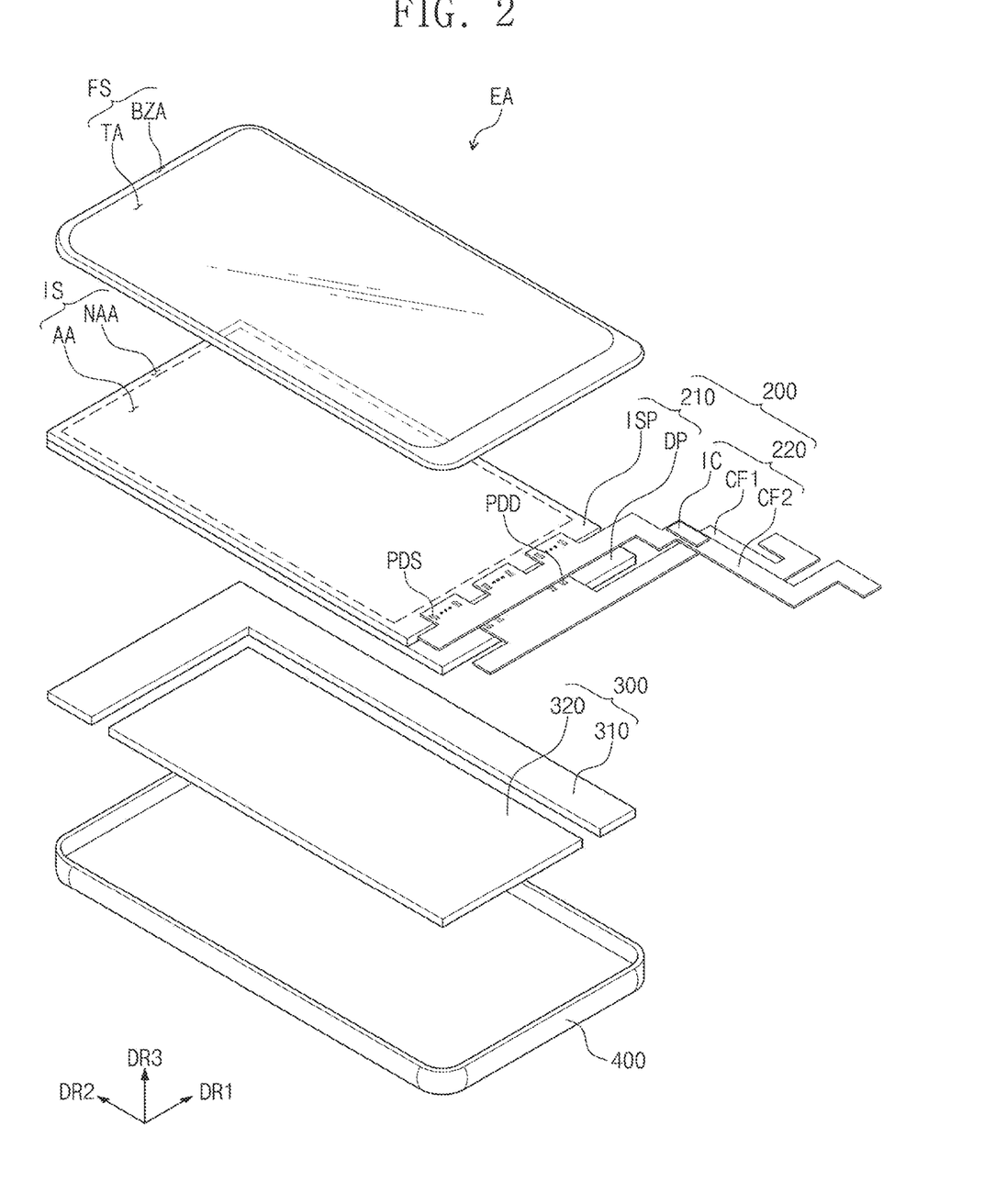
FIG. 2 is an exploded perspective view showing an electronic apparatus according to an embodiment of the present invention.

FIG. 1 is a perspective view showing an electronic apparatus EA according to an embodiment of the present invention, and FIG. 2 is an exploded perspective view thereof.

Referring to FIGS. 1 and 2, the electronic apparatus EA may be activated in response to electrical signals. The electronic apparatus EA may include a variety of embodiments. For example, the electronic apparatus EA may be a tablet computer, a notebook computer, a computer, or a smart television. In the present embodiment, a smart phone will be described as a representative example of the electronic apparatus EA.

The electronic apparatus EA may display an image IM through a front surface FS. The front surface FS may be substantially parallel to a plane defined by a first direction DR1 and a second direction DR2. The front surface FS may include a transmission area TA and a bezel area BZA defined adjacent to the transmission area TA.

The electronic apparatus EA may display the image IM through the transmission area TA. The image IM may include at least one of a still image and a motion image. FIG. 1 shows a clock widget and application icons as a representative example of the image IM.

The transmission area TA may have a square shape having sides substantially parallel to each of the first direction DR1 and the second direction DR2, however, this is merely exemplary. The transmission area TA according to the embodiment of the present invention may have a variety of shapes and should not be particularly limited.

The bezel area BZA may have a predetermined color. The bezel area BZA may be an area having a light transmittance relatively lower than that of the transmission area TA. The bezel area BZA may be adjacent to the transmission area TA. The bezel area BZA may surround the transmission area TA, thereby defining the shape of the transmission area TA. However, this is merely exemplary. The bezel area BZA according to the embodiment of the present invention may be disposed adjacent to only one side of the transmission area TA or may be omitted. The electronic apparatus EA according to the embodiment of the present invention may include various embodiments and should not be particularly limited.

A normal line direction of the front surface FS may correspond to a thickness direction DR3 (hereinafter, referred to as a "third direction") of the electronic apparatus EA. In the present embodiment, front (or upper) and rear (or lower) surfaces of each member may be defined with respect to a direction in which the image IM is displayed. The front and rear surfaces may be opposite to each other in the third direction DR3.

Directions indicated by the first, second, and third directions DR1, DR2, and DR3 are relative to each other, and thus, the directions indicated by the first, second, and third directions DR1, DR2, and DR3 may be changed to other directions. In addition, a surface defined by the first direction DR1 and the second direction DR2 is defined as a "plane", and the expression "when viewed in a plan view" may mean a state of being viewed in the third direction DR3.

The electronic apparatus EA may sense an external input TC applied thereto from the outside. The external input TC may include external inputs of various forms, such as a part of the user's body, light, heat, or pressure. In addition, the electronic apparatus EA may sense an input, e.g., a proximity input, applied when approaching close to or adjacent to the electronic apparatus EA as well as a touch input.

The electronic apparatus EA may include a window 100, an electronic module 200, a control module 300, and an external case 400. The window 100 and the external case 400 are coupled to each other to form an exterior of the electronic apparatus EA.

The window 100 may be disposed on the electronic module 200 and may cover a front surface IS of the electronic module 200. The window 100 may include an optically transparent insulating material. For example, the window may include a glass substrate, a sapphire substrate, or a plastic film. The window 100 may have a single-layer or multi-layer structure. As an example, the window 100 may have a stacked structure in which a plurality of plastic films is attached to each other by an adhesive or a stacked structure in which a glass substrate is attached to a plastic film by an adhesive.

The window 100 may include a front surface FS exposed to the outside. The front surface FS of the electronic apparatus EA may be defined by the front surface FS of the window 100.

The electronic module 200 may be disposed under the window 100. The electronic module 200 may display the image IM and may sense the external input TC. The electronic module 200 may include the front surface IS including a display area AA and a non-display area NAA. The display area AA may be an area activated in response to electrical signals.

The display area AA according to the embodiment of the present invention may be an area in which the image IM is displayed, and substantially simultaneously, the external input TC is sensed. The transmission area TA may overlap the display area AA. For example, the transmission area TA may overlap an entire surface or at least a portion of the display area AA. Accordingly, the user may view the image IM through the transmission area TA or may provide the external input TC through the transmission area TA. However, this is merely exemplary. An area in which the image IM is displayed and an area in which the external input TC is sensed may be separated from each other in the display area AA, and, they should not be limited thereto or thereby.

The non-display area NAA may be an area covered by the bezel area BZA. The non-display area NAA may be defined adjacent to the display area AA. The non-display area NAA may surround the display area AA. A driving circuit or a driving line may be arranged in the non-display area NAA to drive the display area AA.

The electronic module 200 may be assembled in a flat state in which the display area AA and the non-display area NAA face the window 100. However, this arrangement is merely exemplary, and a portion of the non-display area NAA may be bent. In this case, the portion of the non-display area NAA may be bent toward a rear surface of the electronic module 200, and thus, the bezel area BZA may be reduced in the front surface of the electronic apparatus EA. In still another arrangement, the electronic module 200 may be assembled in a state where the display area AA is partially bent. However, this is merely exemplary, and the non-display area NAA may be omitted.

The electronic module 200 may include an electronic panel 210 and a circuit unit 220. The electronic panel 210 may include a display panel DP and an input sensing panel ISP.

The display panel DP may have a configuration that substantially generates the image IM. The image IM generated by the display panel DP may be displayed on the front surface IS through the transmission area TA and may be viewed by the user from the outside. According to the embodiment of the present invention, the display panel DP may be a light-emitting type display panel. However, the inventive concept should not limited thereto. For instance, the display panel DP may be an organic light emitting display panel or a quantum dot light emitting display panel. A light emitting layer of the organic light emitting display panel may include an organic light emitting material. A light emitting layer of the quantum dot light emitting display panel may include a quantum dot or a quantum rod.

The input sensing panel ISP may be disposed on the display panel DP. The input sensing panel ISP may sense the external input TC provided from the outside.

The circuit unit 220 may be electrically connected to the electronic panel 210. The circuit unit 220 may include a first circuit film CF1, a second circuit film CF2, and a circuit chip IC. The first circuit film CF1 may be electrically connected to the display panel DP. The first circuit film CF1 may connect the display panel DP and a controller 310. In the embodiment of the present invention, the first circuit film CF1 may be a flexible circuit film.

The first circuit film CF1 may be connected to display pads PDD of the display panel DP disposed in the non-display area NAA. The first circuit film CF1 may provide electrical signals to the display panel DP to drive the display panel DP. The electrical signals may be generated by the controller 310.

The second circuit film CF2 may be electrically connected to the input sensing panel ISP. The second circuit film CF2 may connect the input sensing panel ISP and the controller 310. In the embodiment of the present invention, the second circuit film CF2 may be a flexible circuit film.

The second circuit film CF2 may be connected to sensing pads PDS of the input sensing panel ISP disposed in the non-display area NAA. The second circuit film CF2 may provide electrical signals to the input sensing panel ISP to drive the input sensing panel ISP. The electrical signals may be generated by the circuit chip IC disposed on the second circuit film CF2 or by the controller 310.

The circuit chip IC may be mounted on the second circuit film CF2. For example, the circuit chip IC may be mounted on the second circuit film CF2 by a chip-on-film (COF) method. The circuit chip IC may include a driving chip that transmits the electrical signals to the input sensing panel ISP. For example, the circuit chip IC may generate the electrical signals necessary for an operation of the input sensing panel ISP based on a control signal provided from the controller 310.

The control module 300 may be disposed under the electronic module 200. The control module 300 may include the controller 310 and a power supply unit 320.

The controller 310 may provide the electrical signals to the electronic module 200. The controller 310 may include a variety of functional modules to drive the electronic module 200 and a connector used to supply a power. The functional modules may include a wireless communication module, an image input module, a sound input module, a memory, an external interface, a light emitting module, a light receiving module, and a camera module. The functional modules may be mounted on a mother board. The mother board may include a rigid printed circuit board. Some of the functional modules may be electrically connected to the mother board via the flexible circuit film without being mounted on the mother board.

Each of the first circuit film CF1 and the second circuit film CF2 may be connected to the controller 310, however, this is merely exemplary. In the electronic module 200 according to the embodiment of the present invention, the display panel DP and the input sensing panel ISP may be connected to different controllers from each other, and one of the first circuit film CF1 and the second circuit film CF2 may not be connected to the controller 310. However, the inventive concept should not be limited thereto or thereby.

The power supply unit 320 may supply the power necessary for the overall operation of the electronic apparatus EA. The power supply unit 320 may include a conventional battery module.

The external case 400 may be disposed under the control module 300. The external case 400 may form an exterior of the electronic apparatus EA with the window 100. The external case 400 may include a material having a rigidity greater than that of the electronic module 200.

In the embodiment of the present invention, the external case 400 may have a single body. However, the inventive concept should not be limited thereto or thereby. For example, the external case 400 according to the embodiment of the present invention may include a plurality of bodies assembled with each other. In detail, the external case 400 may include a plurality of frames and/or plates formed of a glass, plastic, or metal material. The external case 400 may provide a predetermined accommodation space. The electronic module 200 and the control module 300 may be accommodated in the accommodation space and may be protected from external impacts.

Figure 3:
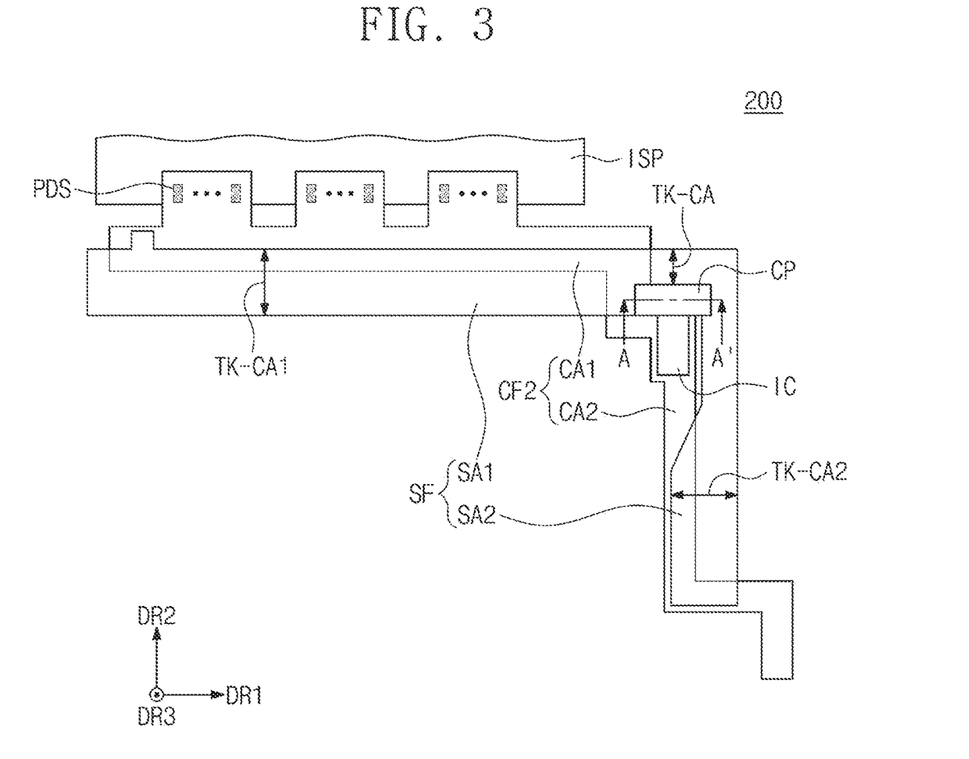
FIG. 3 is a plan view showing a portion of an electronic module according to an embodiment of the present invention.
Figure 4:
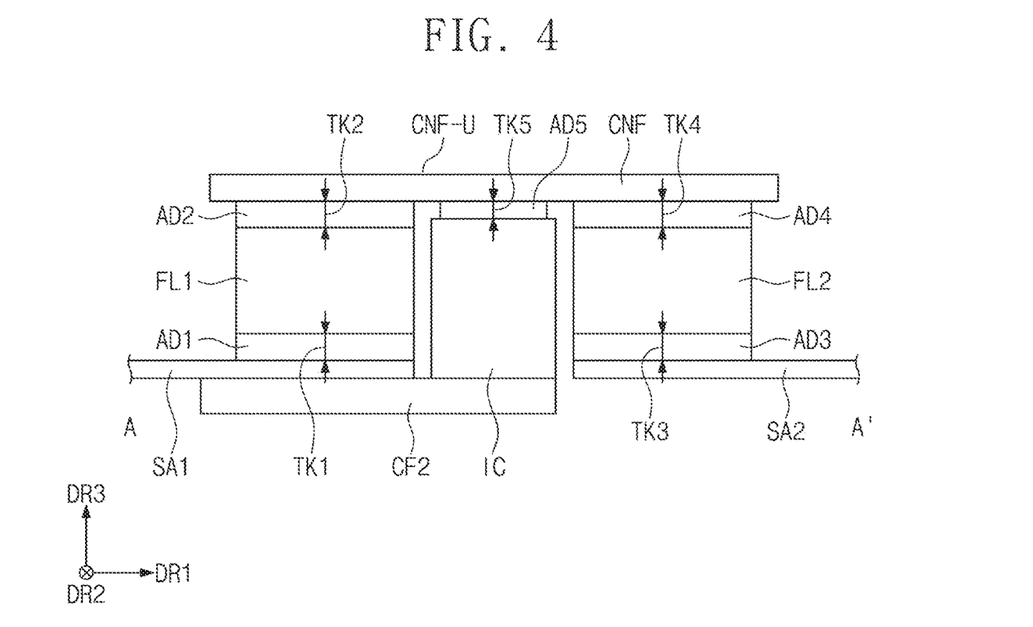
FIG. 4 is a cross-sectional view taken along a line A-A' of FIG. 3 according to an embodiment of the present invention.

FIG. 3 is a plan view showing a portion of the electronic module 200 according to an embodiment of the present invention, and FIG. 4 is a cross-sectional view taken along a line A-A' of FIG. 3.

Referring to FIGS. 3 and 4, the second circuit film CF2 may be connected to the sensing pads PDS of the input sensing panel ISP. The second circuit film CF2 may include a first circuit area CA1 and a second circuit area CA2.

The first circuit area CA1 may be connected to the input sensing panel ISP. The first circuit area CA1 may extend in the first direction DR1.

The second circuit area CA2 may be connected to the first circuit area CA1. The second circuit area CA2 may extend in the second direction DR2 from one side of the first circuit area CA1.

The circuit chip IC may be disposed on the second circuit film CF2.

The electronic module 200 may further include a support film SF and a connection portion CP. The support film SF may be attached onto the second circuit film CF2. The support film SF may support the second circuit film CF2 when the second circuit film CF2 is bent. The support film SF may include polyethylene terephthalate (PET). However, this is merely exemplary, and the support film SF may include a variety of materials. When viewed in a plane, the support film SF may not overlap the circuit chip IC. The support film SF may include a first support area SA1 and a second support area SA2.

The first support area SA1 may be attached to a portion of the first circuit area CA1 by a pressure sensitive adhesive. The first support area SA1 may extend in the first direction DR1.

The second support area SA2 may be attached to a portion of the second circuit area CA2 by a pressure sensitive adhesive. The second support area SA2 may extend in the second direction DR2 from one side of the first support area SA1.

The connection portion CP may be disposed on the circuit chip IC and may connect the first support area SA1 and the second support area SA2. When viewed in the plane, the connection portion CP may overlap the first support area SA1, the second support area SA2, and the circuit chip IC.

As shown in FIG. 4, the connection portion CP may include a connection film CNF, a first filler FL1, a second filler FL2, a first adhesive layer AD1, a second adhesive layer AD2, a third adhesive layer AD3, a fourth adhesive layer AD4, and a fifth adhesive layer AD5.

The connection film CNF may be disposed on the first support area SA1, the second support area SA2, and the circuit chip IC. An upper surface CNF-U of the connection film CNF may be flat. The connection film CNF may include polyethylene terephthalate (PET). However, this is merely exemplary, and the connection film CNF may include a variety of materials. The connection film CNF may include the same material as the support film SF.

The first filler FL1 may be disposed between the first support area SA1 and the connection film CNF. The second filler FL2 may be disposed between the second support area SA2 and the connection film CNF. The first filler FL1 and the second filler FL2 may prevent a step difference from being formed on the upper surface CNF-U of the connection film CNF. The first filler FL1 and the second filler FL2 may include a filler including a foam material. However, this is merely exemplary, and the first filler FL1 and the second filler FL2 may include a variety of other kinds of fillers. The first filler FL1 may be referred to as a "first compensation layer", and the second filler FL2 may be referred to as a "second compensation layer".

The first adhesive layer AD1 may be disposed between the first filler FL1 and the first support area SA1. The second adhesive layer AD2 may be disposed between the first filler FL1 and the connection film CNF. The third adhesive layer AD3 may be disposed between the second filler FL2 and the second support area SA2. The fourth adhesive layer AD4 may be disposed between the second filler FL2 and the connection film CNF. Each of the first adhesive layer AD1, the second adhesive layer AD2, the third adhesive layer AD3, and the fourth adhesive layer AD4 may include the pressure sensitive adhesive.

In the embodiment of the present invention, the first adhesive layer AD1, the second adhesive layer AD2, the third adhesive layer AD3, and the fourth adhesive layer AD4 may be omitted. In this case, the first filler FL1 may be attached directly to the first support area SA1 and the connection film CNF, and the second filler FL2 may be attached directly to the second support area SA2 and the connection film CNF.

The fifth adhesive layer AD5 may be disposed between the circuit chip IC and the connection film CNF. The fifth adhesive layer AD5 may include the pressure sensitive adhesive.

According to an embodiment of the present invention, each of a first thickness TK1 of the first adhesive layer AD1, a second thickness TK2 of the second adhesive layer AD2, a third thickness TK3 of the third adhesive layer AD3, and a fourth thickness TK4 of the fourth adhesive layer AD4 may be greater than a fifth thickness TK5 of the fifth adhesive layer AD5. For example, each of the first thickness TK1, the second thickness TK2, the third thickness TK3, and the fourth thickness TK4 may be at least three times greater than the fifth thickness TK5. In detail, each of the first thickness TK1, the second thickness TK2, the third thickness TK3, and the fourth thickness TK4 may be about 0.1 mm, and the fifth thickness TK5 may be about 0.03 mm.

According to an embodiment of the present invention, an adhesive force of the first adhesive layer AD1, the second adhesive layer AD2, the third adhesive layer AD3, and the fourth adhesive layer AD4 may be greater than an adhesive force of the fifth adhesive layer AD5 such that the connection film CNF may be easily removed from the circuit chip IC.

The support film SF in an area to which the circuit chip IC is adjacent may be designed not to overlap the circuit chip IC when viewed in the plane. An area of the support film SF may have a first width TK-CA. The first width TK-CA may be relatively smaller than a second width TK-CA1 of the first support area SA1 and a third width TK-CA2 of the second support area SA2. For example, the first width TK-CA may be about 2.5 mm. A force supporting the second circuit film CF2 in the area having the first width TK-CA may be weaker than a force supporting the second circuit film CF2 in the areas having the second width TK-CA1 and the third width TK-CA2. In this case, when the second circuit film CF2 is bent, a shape of the support film SF in the area having the first width TK-CA may be deformed, and thus, the second circuit film CF2 may be misaligned. However, according to the embodiment of the present invention, the connection portion CP may reinforce the area having the first width TK-CA. For example, the connection portion CP may be attached to the first support area SA1, the second support area SA2, and the circuit chip IC. According to the present invention, the area of the support film SF may be reinforced by the connection portion CP. Accordingly, when the second circuit film CF2 is bent, the deformation in the shape of the support film SF may be prevented by the connection portion CP. As a result, the second circuit film CF2 that is bent may be prevented from being misaligned. Therefore, a reliability of the electronic module 200 (refer to FIG. 2) may be improved.

Figure 5:
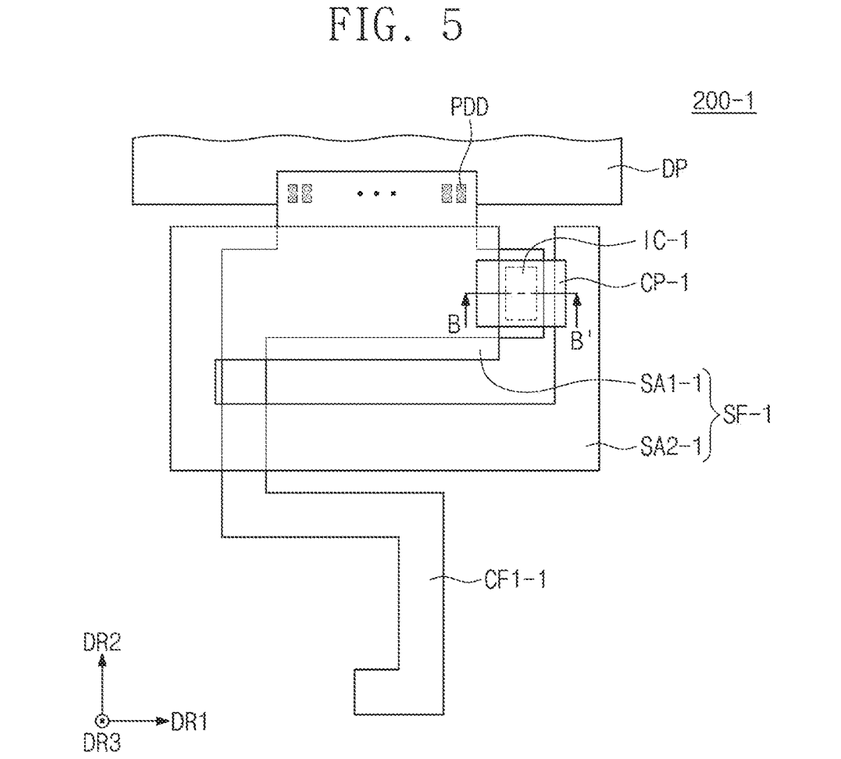
FIG. 5 is a transparent plan view showing a portion of an electronic module according to an embodiment of the present invention.
Figure 6:
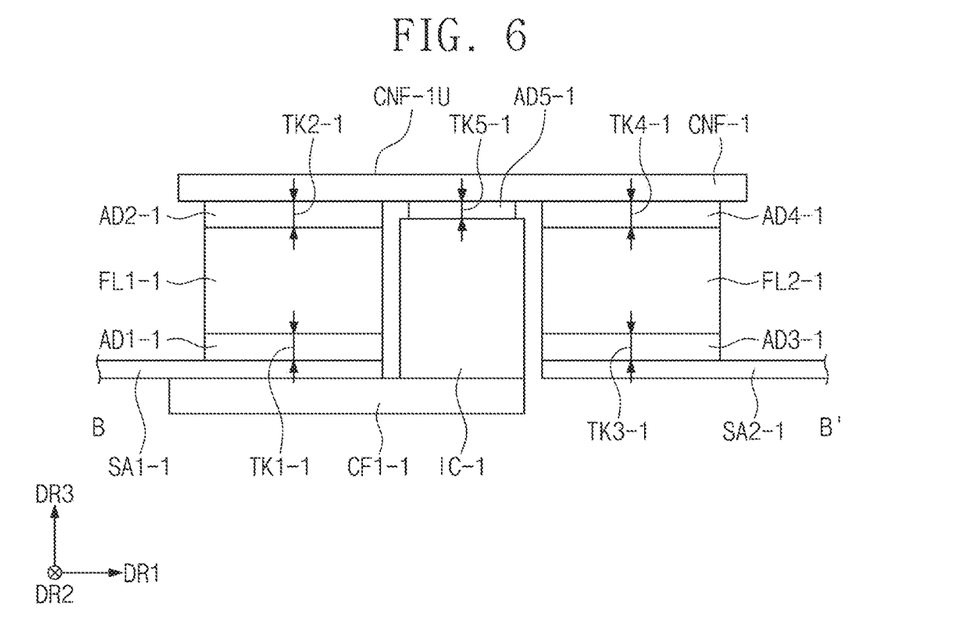
FIG. 6 is a cross-sectional view taken along a line B-B' of FIG. 5 according to an embodiment of the present invention.

FIG. 5 is a transparent plan view showing a portion of an electronic module 200-1 according to an embodiment of the present invention, and FIG. 6 is a cross-sectional view taken along a line B-B' of FIG. 5 according to an embodiment of the present invention.

Referring to FIGS. 5 and 6, a first circuit film CF1-1 may be connected to the display pads PDD of the display panel DP. A circuit chip IC-1 may be disposed on the first circuit film CF1-1. The circuit chip IC-1 may generate electrical signals to drive the display panel DP.

The electronic module 200-1 may further include a support film SF-1 and a connection portion CP-1. The support film SF-1 may be attached onto the first circuit film CF1-1. The support film SF-1 may support the first circuit film CF1-1 when the first circuit film CF1-1 is bent. The support film SF-1 may include polyethylene terephthalate (PET). However, this is merely exemplary, and the support film SF-1 may include a variety of materials. When viewed in a plane, the support film SF-1 may not overlap the circuit chip IC-1. The support film SF-1 may include a first support area SA1-1 and a second support area SA2-1.

When viewed in the plane, the first support area SA1-1 and the second support area SA2-1 may be spaced apart from each other with the circuit chip IC-1 interposed therebetween.

The connection portion CP-1 may be disposed on the circuit chip IC-1 and may connect the first support area SA1-1 and the second support area SA2-1. When viewed in the plane, the connection portion CP-1 may overlap the first support area SA1-1, the second support area SA2-1, and the circuit chip IC-1.

As shown in FIG. 6, the connection portion CP-1 may include a connection film CNF-1, a first filler FL1-1, a second filler FL2-1, a first adhesive layer AD1-1, a second adhesive layer AD2-1, a third adhesive layer AD3-1, a fourth adhesive layer AD4-1, and a fifth adhesive layer AD5-1.

The connection film CNF-1 may be disposed on the first support area SA1-1, the second support area SA2-1, and the circuit chip IC-1. An upper surface CNF-1U of the connection film CNF-1 may be flat. The connection film CNF-1 may include polyethylene terephthalate (PET). However, this is merely exemplary, and the connection film CNF-1 may include a variety of materials. The connection film CNF-1 may include the same material as the support film SF-1.

The first filler FL1-1 may be disposed between the first support area SA1-1 and the connection film CNF-1. The second filler FL2-1 may be disposed between the second support area SA2-1 and the connection film CNF-1. The first filler FL1-1 and the second filler FL2-1 may prevent a step difference from being formed on the upper surface CNF-1U of the connection film CNF-1. The first filler FL1-1 and the second filler FL2-1 may include a filler including a foam material. However, this is merely exemplary, and the first filler FL1-1 and the second filler FL2-1 may include a variety of other kinds of fillers.

The first adhesive layer AD1-1 may be disposed between the first filler FL1-1 and the first support area SA1-1. The second adhesive layer AD2-1 may be disposed between the first filler FL1-1 and the connection film CNF-1. The third adhesive layer AD3-1 may be disposed between the second filler FL2-1 and the second support area SA2-1. The fourth adhesive layer AD4-1 may be disposed between the second filler FL2-1 and the connection film CNF-1. Each of the first adhesive layer AD1-1, the second adhesive layer AD2-1, the third adhesive layer AD3-1, and the fourth adhesive layer AD4-1 may include the pressure sensitive adhesive.

In the embodiment of the present invention, the first adhesive layer AD1-1, the second adhesive layer AD2-1, the third adhesive layer AD3-1, and the fourth adhesive layer AD4-1 may be omitted. In this case, the first filler FL1-1 may be attached directly to the first support area SA1-1 and the connection film CNF-1, and the second filler FL2-1 may be attached directly to the second support area SA2-1 and the connection film CNF-1.

The fifth adhesive layer AD5-1 may be disposed between the circuit chip IC-1 and the connection film CNF-1. The fifth adhesive layer AD5-1 may include the pressure sensitive adhesive.

According to an embodiment of the present invention, each of a first thickness TK1-1 of the first adhesive layer AD1-1, a second thickness TK2-1 of the second adhesive layer AD2-1, a third thickness TK3-1 of the third adhesive layer AD3-1, and a fourth thickness TK4-1 of the fourth adhesive layer AD4-1 may be greater than a fifth thickness TK5-1 of the fifth adhesive layer AD5-1. For example, each of the first, second, third, and fourth thicknesses TK1-1, TK2-1, TK3-1, and TK4-1 may be three times or more greater than the fifth thickness TK5-1. In detail, each of the first, second, third, and fourth thicknesses TK1-1, TK2-1, TK3-1, and TK4-1 may be about 0.1 mm, and the fifth thickness TK5-1 may be about 0.03 mm.

According to an embodiment of the present invention, an adhesive force of the first adhesive layer AD1-1, the second adhesive layer AD2-1, the third adhesive layer AD3-1, and the fourth adhesive layer AD4-1 may be greater than an adhesive force of the fifth adhesive layer AD5-1. Thus, the connection film CNF-1 may be easily removed from the circuit chip IC-1.

The support film SF-1 in an area to which the circuit chip IC-1 is adjacent may be designed not to overlap the circuit chip IC-1 when viewed in the plane. The first support area SA1-1 and the second support area SA2-1 may be spaced apart from each other with the circuit chip IC-1 interposed therebetween. When the first circuit film CF1-1 is bent, a shape of the support film SF-1 may be deformed, and thus, the first support area SA1-1 and the second support area SA2-1 may be misaligned. However, the connection portion CP-1 according to the embodiment of the present invention may be attached to the first support area SA1-1, the second support area SA2-1, and the circuit chip IC-1. According to the present invention, when the first circuit film CF1-1 is bent, the area between the first support area SA1-1 and the second support area SA2-1 may be reinforced by the connection portion CP-1. When the first circuit film CF1-1 is bent, the deformation in shape of the support film SF-1 may be prevented by the connection portion CP-1. As a result, the alignment of the first circuit film CF1-1 that is bent may be prevented from being misaligned. Therefore, a reliability of the electronic module 200-1 may be improved.

Figure 7:
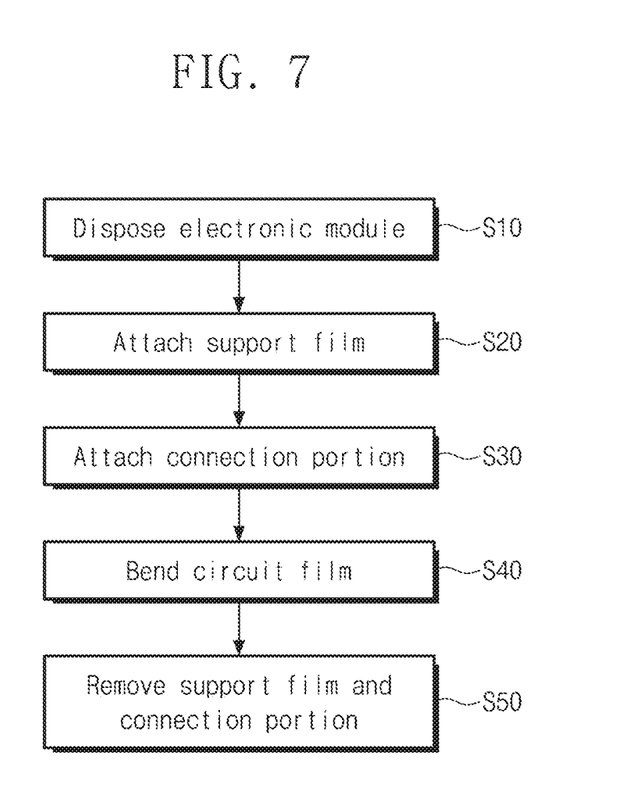
FIG. 7 is a flowchart showing a method of manufacturing an electronic module according to an embodiment of the present invention.
Figure 8:
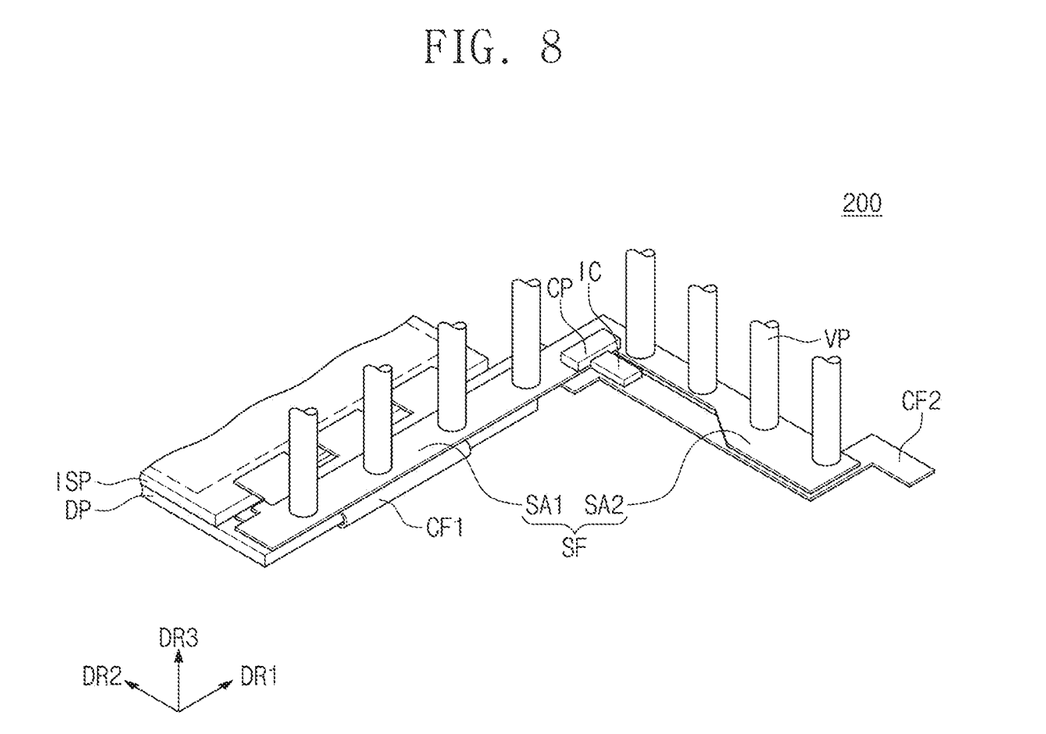
FIG. 8 is a perspective view showing a portion of an electronic module according to an embodiment of the present invention.

FIG. 7 is a flowchart showing a method of manufacturing an electronic module 200 according to an embodiment of the present invention, and FIG. 8 is a perspective view showing a portion of an electronic module 200 according to an embodiment of the present invention.

Referring to FIGS. 7 and 8, the electronic module 200 may be disposed on a stage on which a bending process for the circuit unit 220 (refer to FIG. 2) is performed (S10). The support film SF may be attached onto the second circuit film CF2 (S20). The connection portion CP may be attached onto the support film SF and the circuit chip IC (S30).

The second circuit film CF2 may be bent after the support film SF and the connection portion CP are attached (S40). The bending of the second circuit film CF2 may include adsorbing the support film SF and bending the support film SF and the second circuit film CF2.

The support film SF may be fixed by adsorption portions VP. For example, the support film SF may be vacuum-adsorbed by the adsorption portions VP. Since a width of the second circuit film CF2 is less than a width of the support film SF, a space for the adsorption portions VP to adsorb the second circuit film CF2 may not be provided. However, according to the present invention, since the width of the support film SF is greater than the width of the second circuit film CF2, the adsorption portions VP may adsorb the support film SF. In the state in which the support film SF is adsorbed to the adsorption portions VP, both the support film SF and the second circuit film CF2 may be bent. Thus, the manufacturing method of the electronic module 200 that improves ease of assembly of the electronic module 200 may be provided.

According to the present invention, when the second circuit film CF2 is bent, the area of the support film SF may be reinforced by the connection portion CP. When the second circuit film CF2 is bent, the deformation in shape of the support film SF may be prevented by the connection portion CP. As a result, the alignment of the second circuit film CF2 that is bent may be prevented from being misaligned. Thus, the reliability of the electronic module 200 manufactured by the manufacturing method may be improved.

The adsorption portions VP disposed in the first support area SA1 may be arranged in the first direction DR1 to be spaced apart from each other. The adsorption portions VP disposed in the second support area SA2 may be arranged in the second direction DR2 to be spaced apart from each other.

Figure 9:
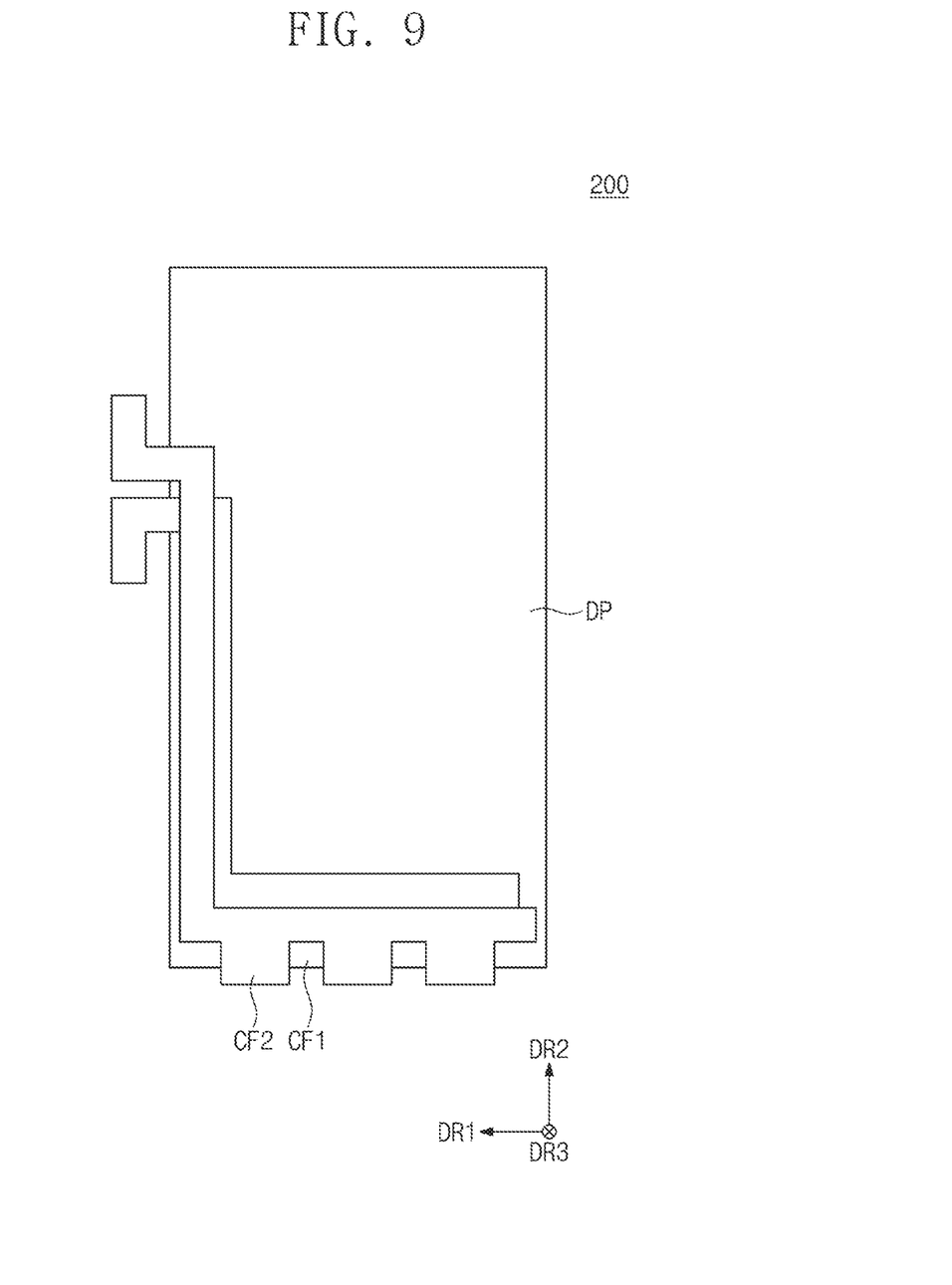
FIG. 9 is a plan view showing an electronic module according to an embodiment of the present invention.

FIG. 9 is a plan view showing an electronic module 200 according to an embodiment of the present invention.

Referring to FIGS. 7 to 9, the first circuit film CF1 and the second circuit film CF2 may be bent and assembled to overlap the rear surface of the display panel DP (S40).

The support film SF and the connection portion CP may be removed after the second circuit film CF2 is bent (S50). The pressure sensitive adhesive may be disposed between the circuit film CF and the support film SF to attach the circuit film CF and the support film SF. The pressure sensitive adhesive may have an adhesive force that allows the support film SF to be easily removed from the circuit film CF.

The first circuit film CF1 and the second circuit film CF2 may be disposed at one side of the display panel DP. The first circuit film CF1 and the second circuit film CF2 may be bent and may be electrically connected to the controller 310 (refer to FIG. 2). According to the present invention, the circuit unit 220 (refer to FIG. 2) of the electronic apparatus EA (refer to FIG. 2) may be disposed at one side of the rear surface of the display panel DP, and thus, a space in which the control module 300 is disposed may be secured. Accordingly, an electronic apparatus EA (refer to FIG. 2) that is slimmed down may be provided.

According to the above, the area of the support film that supports the circuit film may be reinforced by the connection portion. When the circuit film is bent, the support film and the connection portion may prevent misalignment of the circuit film. Thus, the display device having improved reliability and the manufacturing method of the display device may be provided.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. An electronic module comprising:
    an electronic panel;
    a circuit film electrically connected to the electronic panel;
    a circuit chip disposed on the circuit film;
    a support film disposed on the circuit film and defining a groove exposing the circuit chip; and
    a connection part disposed on the circuit chip, attached to the support film, and covering the circuit chip,
    wherein:
    when viewed from a plane, the connection part, the circuit chip, and the circuit film overlap each other;
    when viewed from the plane, the support film surrounds at least part of the circuit chip; and
    the support film and the connection part are removable after the circuit film and the circuit chip are bent to the rear surface of the electronic panel.

2. The electronic module of claim 1, wherein the circuit film comprises a first circuit area connected to the electronic panel and a second circuit area connected to the first circuit area, and the support film comprises a first support area attached to the first circuit area and a second support area attached to the second circuit area.

3. The electronic module of claim 2, wherein the connection part overlaps the first support area, the second support area, and the circuit chip when viewed in a plane.

4. The electronic module of claim 2, wherein the first circuit area extends in a first direction, the second circuit area extends from the first circuit area in a second direction crossing the first direction, the first support area extends in the first direction, and the second support area extends in the second direction from the first support area.

5. The electronic module of claim 2, wherein the connection part comprises a connection film, a first filler disposed between the first support area and the connection film, and a second filler disposed between the second support area and the connection film.

6. The electronic module of claim 5, wherein an upper surface of the connection film is flat.

7. The electronic module of claim 5, wherein the connection part further comprises a first adhesive layer disposed between the first filler and the first support area, a second adhesive layer disposed between the first filler and the connection film, a third adhesive layer disposed between the second filler and the second support area, and a fourth adhesive layer disposed between the second filler and the connection film.

8. The electronic module of claim 7, further comprising a fifth adhesive layer disposed between the circuit chip and the connection film.

9. The electronic module of claim 8, wherein each of the first adhesive layer, the second adhesive layer, the third adhesive layer, and the fourth adhesive layer has an adhesive force greater than an adhesive force of the fifth adhesive layer.

10. The electronic module of claim 8, wherein each of the first adhesive layer, the second adhesive layer, the third adhesive layer, and the fourth adhesive layer has a thickness greater than a thickness of the fifth adhesive layer.

11. The electronic module of claim 2, wherein the first support area and the second support area are spaced apart from each other with the circuit chip interposed therebetween when viewed in a plane.

12. The electronic module of claim 5, wherein the support film comprises a same material as the connection film.

13. The electronic module of claim 1, wherein the support film does not overlap the circuit chip.

14. An electronic module comprising:
- an electronic panel;
- a circuit film electrically connected to the electronic panel;
- a circuit chip disposed on the circuit film;
- a support film disposed on the circuit film and defining a first portion and a second portion spaced apart from the first portion; and
- a connection part disposed on the circuit chip, attached to the first portion and the second portion, and covering the circuit chip, wherein:
- when viewed from a plane, the circuit chip is disposed between the first portion and the second portion;
- the first portion and the second portion are integrally provided, and
- the support film and the connection part are removable after the circuit film and the circuit chip are bent to the rear surface of the electronic panel.

* * * * *